United States Patent [19]

Sue et al.

[11] Patent Number: 4,929,322

[45] Date of Patent: May 29, 1990

[54] APPARATUS AND PROCESS FOR ARC VAPOR DEPOSITING A COATING IN AN EVACUATED CHAMBER

[75] Inventors: Jiinjen A. Sue, Indianapolis; Harden H. Troue, Plainfield, both of Ind.

[73] Assignee: Union Carbide Corporation, Anbury, Conn.

[21] Appl. No.: 363,332

[22] Filed: Jun. 8, 1989

Related U.S. Application Data

[63] Continuation of Ser. No. 906,514, Sep. 12, 1986, abandoned, which is a continuation-in-part of Ser. No. 781,460, Sep. 30, 1985, abandoned.

[51] Int. Cl.[5] .......... C23C 14/34; B05D 3/06

[52] U.S. Cl. .......... 204/192.38; 204/298.41; 427/37; 118/726

[58] Field of Search .......... 204/192.38, 164, 298 D; 427/37, 38; 118/716, 717, 718, 726

[56] References Cited

U.S. PATENT DOCUMENTS

| | | | |
|---|---|---|---|
| 3,625,848 | 12/1971 | Snaper | 204/192 |
| 3,699,623 | 10/1972 | Kreider | 29/156.8 B |
| 3,748,110 | 7/1973 | Hodshire et al. | 29/197 |
| 3,772,174 | 11/1973 | Spalvins | 204/192 |
| 3,783,231 | 1/1974 | Sablev et al. | 219/123 |
| 3,793,179 | 2/1974 | Sablev et al. | 204/298 |
| 3,801,353 | 4/1974 | Brill-Edwards | 117/71 M |
| 3,836,451 | 9/1974 | Snaper | 204/298 |
| 3,922,214 | 11/1975 | Van Cakenberghe | 204/298 |
| 3,961,103 | 6/1976 | Aisenberg | 427/39 |
| 4,123,595 | 10/1978 | Chang | 428/667 |
| 4,132,624 | 1/1979 | King et al. | 204/298 |
| 4,197,175 | 4/1980 | Moll et al. | 204/192 R |
| 4,277,222 | 7/1981 | Barbeau | 415/177 |
| 4,288,306 | 9/1981 | Kieferle et al. | 204/192 R |
| 4,318,672 | 3/1982 | Hansen | 416/224 |
| 4,418,124 | 11/1983 | Jackson et al. | 428/548 |
| 4,448,799 | 5/1984 | Bergman et al. | 427/37 |
| 4,492,522 | 1/1985 | Rossmann et al. | 416/241 R |
| 4,505,947 | 3/1985 | Vukanovic et al. | 427/34 |
| 4,512,867 | 4/1985 | Andreev et al. | 204/298 |
| 4,525,415 | 6/1985 | Porat | 428/216 |
| 4,565,747 | 1/1986 | Nakae et al. | 428/698 |
| 4,590,090 | 5/1986 | Siemers et al. | 427/34 |

FOREIGN PATENT DOCUMENTS

| | | |
|---|---|---|
| 14137 | 4/1980 | Japan . |
| 182962 | 10/1984 | Japan . |

OTHER PUBLICATIONS

H. J. Kolkman, "Erosion of Corrosion Resistant Coatings for Jet Engine Compressors", Proc. 6th Int. Conf. on Erosion by Liquid and Solid Impact.

William D. Sproul, "Very High Rate Reactive Sputtering on TiN, ZrN, and HfN" *Thin Solid Films,* 107 (1983), 141–147.

K. Salmenoja et al, "The Use of Optical Emission Spectroscopy for Process Control in Triode Ion Plating with ZrN" *Vacuum,* vol. 36, Nos. 1–3, 33–35, 1986.

William D. Sproul, "Hafnium Nitride Coatings Prepared by Very High Rate Reactive Sputtering", *Thin Solid Films,* 118 (1984), 279–284.

W. D. Sproul et al, "Reactively Sputtered TiN, ZrN, and HfN", Invited Paper, Extended Abstract, 1984 AVS National Symposium, Reno, Nev.

R. G. Duckworth et al, Paper in *Thin Solid Films,* 63 (1979), 289–297.

*Primary Examiner*—Nam X. Nguyen

*Attorney, Agent, or Firm*—E. Lieberstein

[57] ABSTRACT

A process and apparatus for coating a substrate with source material from a solid cathode in a vacuum chamber supplied with a reactive or inert gas at low pressure. An electric arc is generated between an evaporable end surface of the cathode and an anode. An elongated member surrounds the cathode and extends a predetermined minimum distance "X" beyond the evaporable end surface of the cathode to form a cathode chamber. The inert or reactive gas is directed to flow into the cathode chamber before entering the vacuum chamber.

23 Claims, 4 Drawing Sheets d
15
36
41
37
y
60
62
61
35
40
"x"

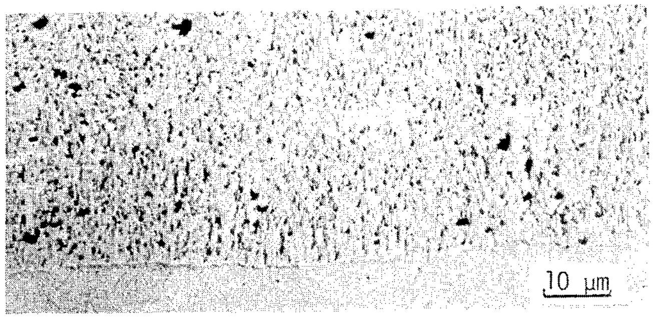
F I G. 3A
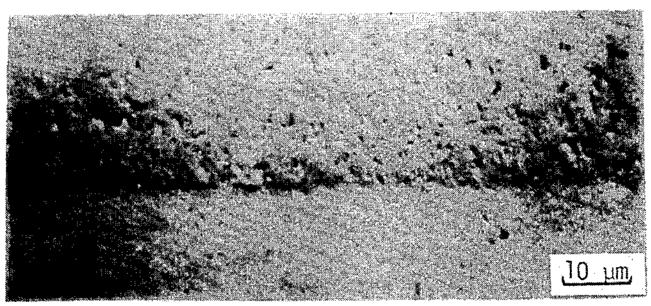
F I G. 3B

APPARATUS AND PROCESS FOR ARC VAPOR DEPOSITING A COATING IN AN EVACUATED CHAMBER

This application is a continuation of U.S. application Ser. No. 906,514 filed Sept. 12, 1986, now abandoned, which is a continuation-in-part of application Ser. No. 781,460, filed Sept. 30, 1985, now abandoned.

FIELD OF INVENTION

This invention relates to a physical vapor deposition arc process and apparatus for coating a substrate in an evacuated atmosphere supplied with a reactive and/or inert gas at low pressure.

BACKGROUND OF INVENTION

Using a high current density electric arc to form a plasma for depositing a coating upon a substrate, within an evacuated chamber, through the evaporation of source material, is known in the art as the "physical vapor deposition arc process." The source material may be supplied from a solid cathode arranged in the evacuated chamber spaced apart from the substrate. The electric arc is formed between the cathode and an anode connected in circuit with a power supply located external of the chamber. The high current density arc forms a plasma in the cathode region of the arc discharge which includes atoms, molecules, ionized atoms and ionized molecules of the "cathode evaporation surface." The "cathode evaporation surface" is that surface of the cathode to which the electric arc attaches. Coating compounds may be deposited and/or formed on the substrate by introducing reactive gases into the chamber adapted to react with the metal vapor in the plasma.

The physical vapor deposition arc process as it is conventionally known and practiced is shown and described in U.S. Pat. Nos. 3,625,848; 3,783,231; 3,836,451; and 3,793,179, respectively. In accordance with conventional practice and as taught in the above-mentioned patents, a reactive gas can be introduced into the evacuated chamber to react with the source material for forming a coating compound but is otherwise considered irrelevant to the process. Moreover, the method of gas introduction and location in the arc chamber is not considered by those skilled in the art to have significance.

It has been discovered in accordance with the present invention that the deposition of source material in the physical vapor deposition arc process may be controlled by introducing a reactive or inert gas into the evacuated chamber in a predetermined manner as will be elaborated upon hereafter. It has been further discovered that the reactive or inert gas may be introduced into the evacuated chamber in a manner which provides adjustable control over the properties and characteristics of the coating. In fact, the method of the present invention can be used to control the crystal orientation of the deposited polycrystalline coating compound. Control over the crystal orientation and residual stress of titanium nitride (TiN) coating using a solid titanium cathode, or zirconium nitride (ZrN) coating using a solid zirconium cathode, and nitrogen-reactive gas as the source materials forms the basis of corresponding patent applications, U.S. Ser. No. 781,459 filed Sept. 30, 1985, and its continuation-in-part application, Ser. No. 905,510, filed concurrently herewith and entitled "Titanium Nitride and Zirconium Nitride Coating Compositions, Coated Articles and Method of Manufacture" herein incorporated by reference. In addition to the control provided over the characteristics of the coating, the process and apparatus of the present invention improve the operation of the physical vapor deposition arc process by maximizing confinement of the arc to the "cathode evaporation surface" and minimizing the potential of the arc to extinguish during operation. Furthermore, the process and apparatus of the present invention permits continuous, stable operation of the apparatus for depositing a coating from the cathode over an extended time period of up to three or four times greater than that operated with the prior art.

SUMMARY OF THE INVENTION

The present invention provides a process and apparatus for vapor depositing a coating comprising source material derived from the cathode onto an object in an evacuated chamber using a high current density arc and provides an improved process and apparatus for vapor depositing a coating comprising source material from a solid cathode upon an object in an evacuated chamber under conditions which permit the cathode to be evaporated continuously and stably for an extended time period.

In the improved physical vapor deposition arc process of the present invention, an object is coated with source material in a vacuum chamber from a solid cathode having an evaporable end surface spaced apart from an anode, comprising the steps of:

generating an electric arc between the evaporable end surface of the cathode and the anode to form a plasma; surrounding the cathode with an elongated member having an open end extending a predetermined minimum distance "x" of above zero beyond the evaporable end surface of the cathode to form a cathode chamber;

directing a flow of gas through the cathode chamber and into the vacuum chamber such that the gas envelops the electric arc over at least the distance "x" before entering the vacuum chamber; and withdrawing the gas from the vacuum chamber to maintain a predetermined pressure within the vacuum chamber.

The physical vapor deposition arc apparatus of the present invention comprises:

a vacuum chamber;

a cathode mounted in the vacuum chamber spaced from an object upon which cathode material is to be deposited, said cathode having an evaporable end surface spaced apart from an anode and from the object;

means for generating an electric arc between the evaporable end surface of the cathode and the anode;

means surrounding the cathode and having an open end projecting a predetermined minimum distance "x" of above zero beyond the evaporable end surface of the cathode to form a cathode chamber;

means for directing a flow of gas through the cathode chamber and into the vacuum chamber such that the gas envelops the electric arc over at least the distance "x" before entering the vacuum chamber; and means for withdrawing the gas from the vacuum chamber to maintain a predetermined pressure within the vacuum chamber.

BRIEF DESCRIPTION OF THE DRAWINGS

The present invention will be best understood from the following detailed description when read in conjunction with the accompanying drawings of which:

FIG. 3A is a micrograph showing a cross-sectional view of the microstructure of a TiN coating formed by using prior art physical vapor deposition arc process and apparatus;

FIG. 3B is a micrograph showing a cross-sectional view of the microstructure of an improved TiN coating formed by arc evaporation in accordance with the physical vapor deposition arc process of the present invention.

DETAILED DESCRIPTION OF THE PREFERRED EMBODIMENT

Figure 1:
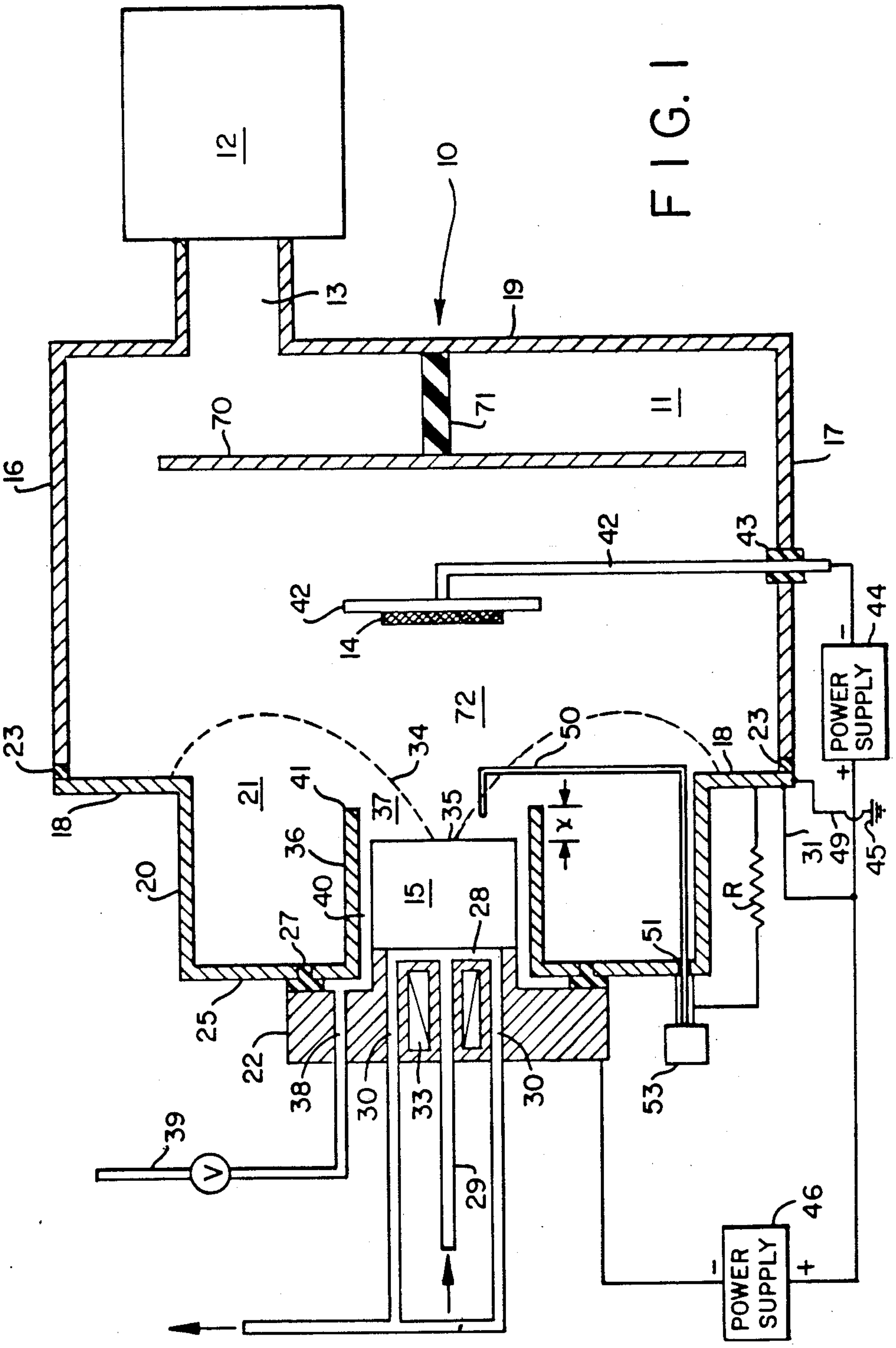
FIG. 1 is a side view elevation partly in cross-section and partly schematic of the apparatus of the present invention.

Referring now to FIG. 1, in which the electric arc physical vapor deposition apparatus of the present invention is shown comprising a shell 10 having a vacuum chamber 11 which is evacuated to a desired operating pressure of generally between $10^{-1}$ to $5\times10^{-4}$ torr and preferably between $5\times10^{-2}$ and $5\times10^{-3}$ torr by a conventional vacuum pumping system 12 communicating with the vacuum chamber 11 through an open port 13.

The vacuum chamber 11 may have any desired geometry and be of any desired size to accommodate one or more objects 14 (substrates) to be coated with source material provided by evaporating one or more solid cathodes 15 in accordance with the practice of the present invention. For illustrative purposes, the shell 10 is shown having a generally rectangular body which, in cross-section, has an upper wall 16, a lower wall 17, and side walls 18 and 19, respectively. The shell 10 further can include an additional section 20 which projects an arbitrary distance from the side wall 18. The side wall 18 has an opening 21 through which the cathode 15 communicates with the vacuum chamber 11.

The cathode 15 is attached to a cathode support assembly 22. The cathode support assembly 22 is mounted on a flange 25 through an insulator 27. The mounting flange 25 is connected to section 20 of the shell 10. The support block 22 has a relatively small cavity 28 which connects with an inlet passage 29 and exit passages 30. A coolant such as water is circulated through the cavity 28 from a source (not shown). The coolant flows from the source through inlet conduit 29 into the cavity 28 and returns to the source through the exit passages 30. A DC magnet 33 is disposed within the support block 22 and serves to diffuse the point of attachment of an electric arc 34 over the arc evaporation surface 35 of the cathode 15.

Figures 2, 2A, 2B, 2C:
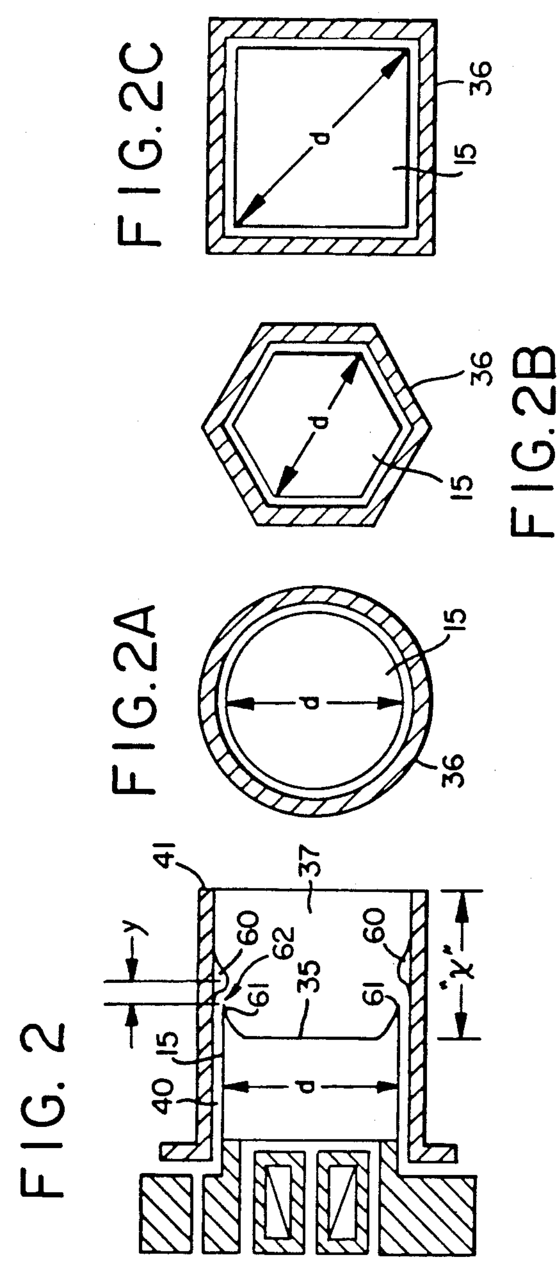
FIG. 2 is an enlargement of the cathode assembly of FIG. 1 after operating for an extended period of time with the cathode shown partially evaporated and with a buildup of evaporated material shown on the inside wall surface of the elongated member.
FIGS. 2A, 2B, and 2C are respective end views of alternate geometries for the cathode and the elongated member.

A hollow elongated member 36 surrounds the cathode 15 to form a relatively narrow space 40. The elongated member 36 is attached to the mounting flange 25 through the insulator 27. The geometry of the member 36 and open end 41 should substantially conform to the geometry and dimension of the cathode 15 as shown in FIGS. 2A, 2B and 2C, respectively The elongated member 36 should be substantially uniform in cross-sectional dimension over its length. This assures that the open end 41 does not restrict the plasma flow as it exits member 36. Accordingly, if a cylindrical or disk shaped cathode is used, the member 36 should preferably be tubular in shape with the narrow space 40 being annular in cross-section. For a 6.35 cm diameter cathode the thickness of the annular space 40 can range from about 0.08 cm to about 0.24 cm. An inlet opening 38 in the support block 22 directly communicates with the narrow space 40 and with an input gas supply line 39. Gas is fed through the gas supply line 39 from a source of gas (not shown) into the narrow space 40 from whence the gas is directed through the cathode chamber 37 into the vacuum chamber 11. A valve V is used to control the flow of gas through the supply line 39.

The elongated member 36 projects a predetermined distance "x" beyond the cathode evaporable end surface 35 to form a cathode chamber 37. The extension "x" between the open end 41 of the member 36 and the evaporable end surface 35 must be above zero and up to a maximum of, for example, about 13 cm in length for a 6.35 cm diameter cathode. The distance "x" is measured from the cathode evaporable end surface 35 as shown in FIG. 2 to the open end 41 of the elongated member 36. The preferred minimum distance "x" is at least about one centimeter and the preferred range for "x" is between 2 to 6 cm for a 6.35 cm diameter cathode. Similar aspect ratios of "x", herein defined as x/d where "d" is the major dimension of the cathode evaporable end surface 35, must be maintained for all cathode geometries such as those shown in FIGS. 2A, 2B and 2C, respectively. The aspect ratio must be above zero and up to a maximum of about 2.0. The preferred minimum aspect ratio is at least about 0.07 and the preferred range of the aspect ratio is between 0.3 and 1.0. The critical requirement and importance of recessing the cathode within the member 36 to form a cathode chamber 37 will be discussed at greater length later in the specification. The elongated member 36 may preferably be composed of any material that does not interfere with the function of magnet 33 in diffusing the attachment of electric arc 34 over the arc evaporation surface 35 and can comprise any non-magnetic material suitable for high temperature vacuum service, e.g., non-magnetic stainless steel.

The object 14 is mounted upon a support plate 42 located within the vacuum chamber 11 and spaced apart from the evaporable end surface 35 of the cathode 15. The type of structure used to support or suspend the object 14 within the vacuum chamber 11 depends upon the size, configuration and weight of the object. For simplicity, the object 14 is shown having a rectangular geometry with a flat surface facing the cathode evaporation end surface 35. It should be understood that the object 14 may have any configuration and may be supported in any fashion. The object 14 may also be of any suitable composition capable of withstanding the high temperature, vacuum conditions existing in the chamber 11 and can be made of such materials as refractory metal, refractory alloy, superalloy, stainless steel, and ceramic composites. The support plate 42 should, however, be composed of a conductive material and is connected to a metal rod 42 which extends through an insulated high voltage feed-through port 43 in the lower wall 17 of the shell 10. The metal rod 42 is connected to the negative terminal of a bias power supply 44 located external of the shell 10 with the positive terminal of the bias power supply 44 connected to side wall 18 through electrical lead 31.

The vacuum chamber 11 further can include an electrically insulated surface 70 located opposite the cathode evaporable end surface 35 with the object 14 and support plate 42 positioned therebetween. The electrically insulated surface 70 can be itself comprised of an insulator material or can be comprised of a conductive material which is insulated from the chamber 10 by insulator 71 shown. This electrically insulated surface 70 serves to substantially confine the plasma to the chamber volume 72 between surface 70 and cathode evaporable end surface 35 wherein the object 14 is located without surface 70 attracting ions or electrons from the plasma and further serves to prevent interaction between plasmas when multiple evaporators are accommodated in chamber 11.

Arc current is supplied from a main power supply 46 located external of the shell 10. The main power supply 46 has its negative terminal connected to the cathode support block 22 and its positive terminal connected to the side wall 18. The electric arc 34 is formed between the cathode 15 and the side wall 18 of the shell 10. The side wall 18 represents the anode and can be connected to ground potential 45 through an electrical lead 49. Alternatively, the anode may be formed from another conductive member (not shown) mounted adjacent to but electrically separated from the side wall. The geometry of such anode would not be critical. In the latter case, the arc conduit can be electrically isolated from the shell 10. It is also obvious that the side wall 18 can be electrically insulated from the other walls of the shell 10 by using insulating separators such as those shown at 23. It is also obvious that the anode side wall 18 can be free-floating with the ground at 45 removed and the shell wall 16, 17 and 19 grounded.

Any conventional arc starting procedure may be used including physically contacting the cathode end surface 35 with a wire electrode 50. The wire electrode 50 is electrically connected to anode side wall 18 or a separate anode (not shown) through a high resistance R. In addition the wire electrode 50 is connected to a plunger assembly 53 through an insulated sleeve 51 in the mounting flange 25. The plunger assembly 53 moves the wire electrode into physical contact with the cathode end surface 35 and then retracts it. A conventional plunger assembly for performing this operation is taught and described in U.S. Pat. No. 4,448,799. However, any mechanism capable of moving the starting wire electrode 50 into contact with the cathode 15 and withdrawing it may be used to practice the present invention. Alternatively, an arc may be started by other conventional methods including transferred arc starting and spark starting using a spark plug.

In touch starting, once contact is made between the starting wire electrode 50 and the cathode 15, current flows from the main power supply 46 through the cathode 15 and wire electrode 50 to anode side wall 18. Retraction of the wire electrode 50 breaks contact with the cathode 15 to form an electric arc. The high resistance R causes the arc to transfer to the anode side wall 18 which is a less resistive path than the path to the wire electrode 50.

Any gas may be supplied to the cathode chamber 37 and then to vacuum chamber 11 through the narrow space 40 of elongated member 36 depending upon the coating to be formed on the object 14. The use of an inert gas such as argon is preferred for depositing a coating of elemental or alloy source material corresponding to the cathode material, e.g., Si, Cu, Al, W, Mo, Cr, Ta, Nb, V, Hf, Zr, Ti, Ni, Co, Fe and their alloys including alloying elements Mn, Si, P, Zn, B and C. The inert gas in this instance is not intended to react with the metal vapor in the plasma. Other inert gases that may be used include neon, krypton, xenon and helium. Reactive gases include nitrogen, oxygen, hydrocarbons such as $CH_4$ and $C_2H_2$, carbon dioxide, carbon monoxide, diborene ($B_2H_6$), air, silane ($SiH_4$) and combinations. Nitrogen is used as the preferred reactive gas with metal vapor from metal cathodes including Ti, Zr, Hf, V, Nb, Ta, Cr, Mo, W, Si and Al to form refractory nitride coatings TiN, $Ti_2N$, ZrN, HfN, VN, $V_3N$, $Nb_2N$, NbN, TaN, $Ta_2N$, CrN, $Cr_2N$, MoN, $Mo_2N$, $Mo_3N$, WN, $W_2N$, $Si_3N_4$, AlN and their compounds. Nitride-metal composites such as TiN-Ni and ZrN-Ni and complex nitrides such as (Ti,Zr)N, (Ti,Al,V)N and (Ti,V)N can be produced by employing multiple or composite cathodes. Accordingly, carbide, oxide and boride compound coatings can be produced when a reactive gas comprised of carbon, oxygen and boron is used, for example TiC, TiO, $TiO_2$ and $TiB_2$. In addition, interstitial nitride-, carbide-, boride- and oxide-compound coatings can also be made by employing more than one reactive gas species, for example, TiCN, TiON and TiOCN. In all cases, the gas should be fed into the cathode chamber 37 and then into the vacuum chamber 11 at rate compatible with the withdrawal rate of the vacuum pumping system to maintain the desired operating pressure of between $10^{-1}$ to $5\times10^{-4}$ torr.

The plasma produced by the high current density arc includes atoms, molecules, ionized atoms and ionized molecules of the cathode evaporation surface 35 and ionized species of gases. Biasing the object 14 negatively with respect to the anode or to both the anode and cathode influences the smoothness, uniformity and surface morphology of the coating. The bias power supply should be adjusted to a bias potential to optimize the coating operation. For a TiN, or ZrN, coating a bias potential for power supply 44 of between 50 and 400 volts is acceptable with a bias potential between 100 and 200 volts preferred for TiN and a bias potential between 50 and 250 volts preferred for ZrN.

Gas is fed through the space 40 into the cathode chamber 37 representing the volume of space between the cathode evaporation surface 35 and the open end 41 of the elongated member 36. The gas envelops the high current density arc in the cathode chamber 37 over the distance "x" resulting in an increase of plasma pressure and temperature. The plasma extends from the cathode evaporation surface 35 through the relatively high pressure region in the cathode chamber 37 and exits through the open end 41 of the elongated member 36 towards the relatively lower pressure region in the vacuum chamber 11, or chamber volume 72, where the negatively biased substrate 14 is located. An additional benefit of feeding gas through the narrow space 40 into cathode chamber 37 is that the gas in space 40 serves as an insulator to prevent arcing from the cathode 15 to the member 36.

During operation, some of the evaporated cathode material will deposit on the inside surface of the member 36 to form a deposit 60. This is diagrammatically illustrated in FIG. 2. The gas injected from narrow space 40 prevents the deposit 60 from accumulating and bridging over to the cathode 15. Instead, as the operation proceeds, a convergent nozzle 62 is formed between the deposit 60 and the outer edge 61 of the cathode 15. The outer edge 61 becomes more pronounced as the evaporable end surface 35 is consumed. The gas flows through this convergent nozzle 62 across the face 35 of cathode 15 and into the plasma contained in cathode chamber 37. After prolonged operation, both the evaporable end surface 35 and the outer edge 61 recede enlarging the distance "x". The enlargement in the distance "x" is less than about 0.35 cm during normal operation and is therefore insignificant to the method of the invention. The deposit 60 apparently continues to accumulate as the edge 61 recedes so as to maintain the dimension "y" of the convergent nozzle 62 substantially constant by shifting its position in conjunction with the eroded outer edge 61. The dimension "y" is maintained substantially constant at a value greater than zero and less than about 0.4 cm over the range of operating parameters. Control over the dimension "y" results from the method of introducing gas into the cathode chamber 37. Accordingly, the operation of the convergent nozzle 62 is a self-correcting phenomenon which assures that the gas continues to be directed across the face 35 of the cathode 15 as it flows into the cathode chamber 37 from narrow space 40. In accordance with the present invention, the gas must always first enter the cathode chamber 37 before the gas enters the vacuum chamber 11, or chamber volume 72.

Figure 4:
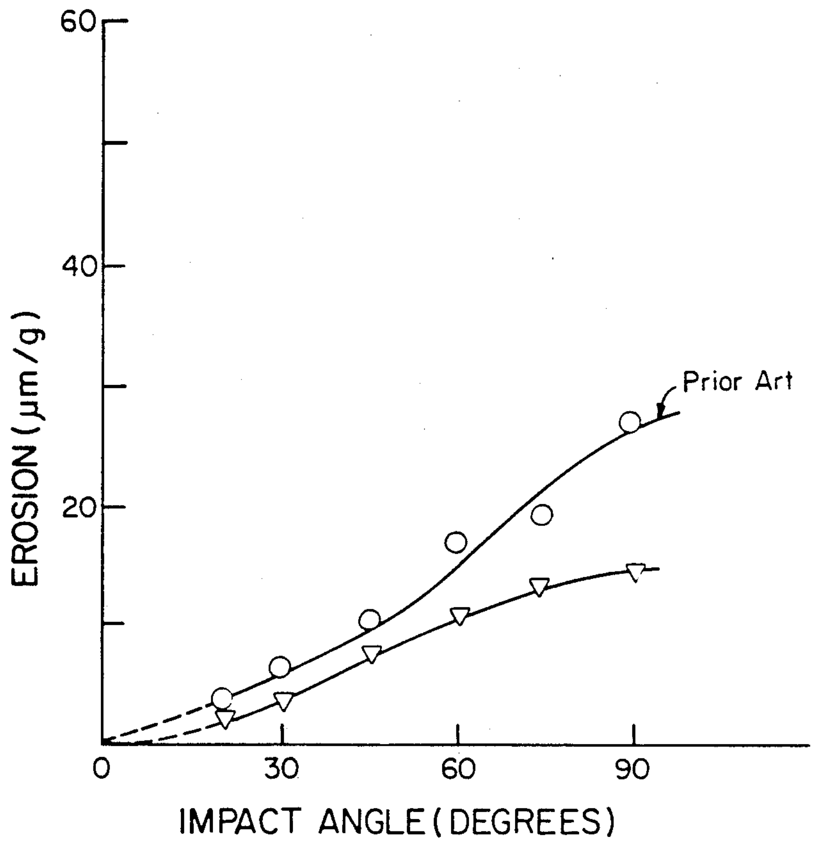
FIG. 4 is a graph comparing the erosion characteristics of a prior art physical vapor deposition arc evaporated TiN coating versus impact angle against an improved TiN coating formed by the apparatus and method of the present invention.

The microstructure of the coating is altered by the process of the present invention and more particularly by adjustment of the distance "x" with all other process variables held constant. FIGS. 3A and 3B show a comparison between the microstructure of a TiN coating formed in accordance with prior art practice and in accordance with the process of the present invention. As is apparent from FIG. 3B relative to FIG. 3A, the coating produced by the apparatus and method of the present invention is a sound, dense structure with a smooth surface. It was further observed that adjustment of the distance "x" will vary the physical properties of the coating such as its erosion characteristics. The graph of FIG. 4 compares the erosion characteristics of a prior art physical vapor deposition arc evaporated TiN coating with a TiN coating formed in accordance with the present invention. The degree of erosion is measured against the impact angle at which the eroding alumina material is directed. The TiN coating formed in accordance with the present invention using a recess distance of 5.7 cm for "x" and a 6.35 cm diameter cathode results in a relatively flat low erosion characteristic even at impact angles between sixty to ninety degrees compared to the prior art TiN coating which has a comparatively poor erosion characteristic particularly at high impact angles.

EXAMPLES 1 and 2

Examples 1 and 2 further illustrate the invention and are carried out in the apparatus shown in FIG. 1 using the materials and process parameters given in Table I below to produce TiN and ZrN coated substrates, respectively, having the I(111)/I(200) intensity ratios, the interplanar spacing values, $d_{111}$, and 90° volume (50 μm alumina) erosion rate given below for each of Examples 1 and 2. The 90° volume erosion rate test is carried out by impacting angular 50 μm alumina particles using test apparatus based upon ASTM G 76-83 guidelines. The test uses compressed air at 248 KPa to deliver at least a 200 g charge of angular 50 μm alumina particles through a 5 mm diameter nozzle at a nominal rate of 450 g/min. with a nominal velocity of 60 m/s and a nozzle-to-specimen standoff of 10 cm at an impact angle of 90° to the specimen surface.

TABLE I

| | Example 1 | Example 2 |
|---|---|---|
| Coating Composition | TiN | ZrN |
| I(111)/I(200) | 175 | 55 |
| $d_{(111)}$ | 2.455 Å | 2.656 Å |
| 90° Volume Erosion Rate | $8.5 \times 10^{-3}$ mm³/g | $5.7 \times 10^{-3}$ mm³/g |
| Substrate | 410SS | IN718 |
| Cathode Composition | Ti | Zr |
| Cathode (cylindrical) Diameter | 6.35 cm | 6.35 cm |
| Dimension "x" | 3.8 cm | 2.6 cm |
| Spatial Standoff | 39 cm | 30 cm |
| Chamber Pressure | 0.018 torr | 0.042 torr |
| $N_2$ Gas Flow | 340 sccm | 215 sccm |
| Arc Current | 125 Adc | 139 Adc |
| Substrate Bias | 150 Vdc | 250 Vdc |
| Deposition Rate | 0.065 μm/min. | 0.092 μm/min. |
| Substrate Temp. | 480° C. | 670° C. |

TiN and ZrN coatings have been successfully applied on a number of substrate materials such as refractory metals including Ti, Zr, V, Ta, Mo and W, superalloys including Inconel 718, Inconel 738, Waspaloy and A-286, stainless steels including 17-4PH, AISI 304, AISI 316, AISI 403, AISI 422, AISI 410, and AM355, Ti alloys including Ti-6Al-4V and Ti-6Al-2Sn-4Zr-2Mo and Ti-8Al-1Mo-1V, aluminum alloys including 6061 and 7075, WC-CO Cermet, and $Al_2O_3$ ceramics. The above-identified substrates are described in detail in Materials Engineering/Materials Selector '82, published by Penton/IPC, subsidiary of Pittway Corporation, 1111 Chester Ave., Cleveland, Ohio 44114. in 1981, and Alloy Digest, published by Alloy Digest, Inc., Post Office Box 823, Upper Montclair, N.J., in 1980.

What we claim is:

1. A process for coating an object with source material in a vacuum chamber which comprises;
   (a) providing within said vacuum chamber a solid cathode and an anode with each being spaced apart from one another and from said object and with said cathode having an evaporable and surface for supplying said source material;
   (b) arranging said cathode in said vacuum chamber with its evaporable end surface facing said object;
   (c) evacuating said vacuum chamber to an operating pressure of between $10^{-1}$ and $5\times10^{-4}$ torr;
   (d) surrounding said cathode with an elongated member uniform in cross sectional dimension over its length to form a narrow space between the elongated member and said cathode with said elongated member having an open end extending beyond the evaporable end surface of the cathode a distance calculated from the ratio of x/d of from 0.07 to 2 forming a cathode chamber between said evaporable end surface and said open end where "x" represents the axial dimension between said evaporable end surface and said open end and "d" represents the major dimension of the cross-section of said evaporable end surface;

(e) generating an electric arc between the evaporable end surface of the cathode and the anode;

(f) maintaining said elongated member electrically insulated from both the cathode and the anode for preventing arcing between the cathode and said member and from between said member and the anode;

(g) introducing gas into said narrow space at a pressure higher than the operating pressure established within the vacuum chamber and in a direction so as to envelop the arc in said cathode chamber before entering the vacuum chamber such that the arc termination at the cathode is confined to the evaporable end surface with the arc caused to traverse a path extending from said evaporable end surface around the open end of said elongated member to said anode;

(h) withdrawing gas from the vacuum chamber to maintain the pressure within the vacuum chamber at said operating pressure; and (i) depositing a coating of source material upon the object.

2. A process as defined in claim 1 wherein the gas introduced into said narrow space is inert and is selected from the class consisting of argon, neon, krypton, xenon, helium and combinations thereof.

3. A process as defined in claim 2 wherein the gas introduced into said narrow space is reactive and is selected from the class consisting of nitrogen, oxygen, hydrocarbons, carbon dioxide, carbon monoxide, diborene, air, silane and combinations thereof.

4. A process as defined in claim 1 wherein the object is biased to a negative potential difference relative to the anode of between 50 and 400 volts.

5. A process as defined in claim 1 wherein the object is biased to a negative potential difference relative to both the anode and the cathode of between 50 and 400 volts.

6. A process as defined in claim 1 wherein the elongated member has a circular cross-section and wherein the cathode has a circular cross-section.

7. A process as defined in claim 1 wherein x/d is between 0.3 and 1.0.

8. A process as defined in claim 7 wherein the object is composed of a material selected from the class consisting of refractory metals, superalloys, stainless steels, and a ceramic composites.

9. A process as defined in claim 8 wherein the object is positioned between the solid cathode evaporable end surface and an electrically insulated surface.

10. A process as defined in claim 7 wherein the object is composed of titanium alloy.

11. Apparatus for depositing a coating of source material upon an object in an evacuated vacuum chamber comprising:

(a) a cathode having an evaporable end surface for supplying said source material, with said cathode disposed in said vacuum chamber with its evaporable end surface facing said object;

(b) an anode spaced apart from the cathode and the object;

(c) means for evacuating said vacuum chamber to an operating pressure of between $10^{-1}$ and $5\times10^{-4}$ torr;

(d) an elongated member surrounding the cathode to form a narrow space there between with said elongated member being uniform in cross-sectional dimension over its length and having an open end projecting beyond the evaporable end surface of the cathode a distance calculated from the ratio x/d of from 0.07 to 2 for forming a cathode chamber between said evaporable end surface and said open end where "x" represents the axial dimension between said evaporate end surface and said open end and "d" represents the major dimension of the cross section of said evaporable end surface;

(e) means for generating an electric arc between the evaporable end surface of the cathode and the anode;

(f) means for introducing gas into said narrow space at a pressure higher than the operating pressure established within the vacuum chamber and in a direction to flow through the cathode chamber before entering the vacuum chamber;

(g) means for maintaining said elongated member electrically insulated from both said cathode and said anode; and (h) means for withdrawing the gas injected into the vacuum chamber to maintain said operating pressure in said vacuum chamber.

12. Apparatus as defined in claim 11 wherein the means for generating the electric arc includes power supply means located external of the vacuum chamber.

13. Apparatus as defined in claim 12 wherein said elongated member is composed of nonmagnetic material.

14. Apparatus as defined in claim 13 wherein said elongated member has a geometrical shape substantially corresponding to the geometrical shape of the cathode.

15. Apparatus as defined in claim 14 wherein said narrow space is an annular in cross-section.

16. Apparatus as defined in claim 15 wherein the electrical potential of the object is at a negative potential relative to the anode and the cathode.

17. Apparatus as defined in claim 16 wherein the negative potential is between 50 and 400 volts.

18. Apparatus as defined in claim 15 wherein the anode is an integral part of the vacuum chamber.

19. Apparatus as defined in claim 15 wherein the anode is connected to ground potential.

20. Apparatus as defined in claim 15 wherein the anode is isolated electrically from the vacuum chamber.

21. Apparatus as defined in claim 15 wherein the surface of an electrically insulated member is positioned opposite the cathode evaporable end surface.

22. Apparatus as defined in claim 21 wherein the object is placed between the surface of electrically insulated member and the cathode evaporable end surface.

23. Apparatus as defined in claim 15 wherein the cathode is selected from the class consisting of Si, Cu, Al, W, Mo, Cr, Ta, Nb, V, Hf, Zr, Ti, Ni, Co, Fe and their alloys.

* * * * *

UNITED STATES PATENT AND TRADEMARK OFFICE

CERTIFICATE OF CORRECTION

PATENT NO. : 4,929,322

DATED : May 29, 1990

INVENTOR(S) : Jiinjen A. Sue; Harden H. Troue

It is certified that error appears in the above-identified patent and that said Letters Patent is hereby corrected as shown below:

Column 1, line 39, delete "In accordance with conventional practice and as taught in the above-mentioned patents, a reactive gas can be introduced into the evacuated chamber to react with the source material for forming a coating compound but is otherwise considered irrelevant to the process. Moreover, the method of gas introduction and location in the arc chamber is not considered by those skilled in the art to have significance." and substitute therefor --In accordance with conventional practice a reactive gas can be introduced into the evacuated chamber for causing a reaction with the source material to form a coating compound which deposits on the object without otherwise interfering with the physical vapor deposition arc process. The method of gas introduction and the location of gas introduction into the arc chamber is not considered by those skilled in the art to affect the reaction between the reactive gas and the source material and is accordingly deemed to be immaterial. --.

Column 8, line 54, delete "and" and substitute therefor --end--.

Signed and Sealed this

Fifteenth Day of October, 1991

*Attest:*

HARRY F. MANBECK, JR.

*Attesting Officer* *Commissioner of Patents and Trademarks*